(12) United States Patent
Lai

(10) Patent No.: US 7,777,570 B2
(45) Date of Patent: Aug. 17, 2010

(54) TRANSFORMER POWER COMBINER HAVING SECONDARY WINDING CONDUCTORS MAGNETICALLY COUPLED TO PRIMARY WINDING CONDUCTORS AND CONFIGURED IN TOPOLOGY INCLUDING SERIES CONNECTION AND PARALLEL CONNECTION

(75) Inventor: Jie-Wei Lai, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/242,892

(22) Filed: Sep. 30, 2008

(65) Prior Publication Data

US 2009/0231076 A1     Sep. 17, 2009

Related U.S. Application Data

(60) Provisional application No. 61/035,740, filed on Mar. 12, 2008.

(51) Int. Cl.
 *H03F 3/26* (2006.01)
 *H03F 1/00* (2006.01)
 *H03F 3/00* (2006.01)

(52) U.S. Cl. .................. 330/276; 330/165; 330/171; 330/188

(58) Field of Classification Search ................ 330/276, 330/148, 151, 171, 188
 See application file for complete search history.

(56) References Cited

U.S. PATENT DOCUMENTS 3,815,030 A * 6/1974 Morrison .................... 327/129
5,389,890 A    2/1995 Burrage
6,549,071 B1   4/2003 Paul
7,129,784 B2  10/2006 Bhatti
2002/0135422 A1  9/2002 Aoki
2003/0067672 A1*  4/2003 Bodeep et al. ........... 359/341.4
2005/0180173 A1*  8/2005 Batarseh et al. ................ 363/15
2008/0094164 A1*  4/2008 Hsu ........................... 336/200

OTHER PUBLICATIONS

Avantek, GaAs IC system, p. 267, 1989.
Jeng-Han Tsai, "A 90-nm CMOS Broadband and Miniature Q-band Balanced Medium Power Amplifier", MTT-S, p. 1129, 2007.
Nebil Tanzi, "A 1-Watt Doubly Balanced 5GHz Flip-Chip SiGe Power Amplifier", RFIC, p. 141, 2003.
Kyu Hwan An, "A Monolithic Voltage-Boosting Parallel-Primary Transformer Structures for Fully Integrated CMOS Power Amplifier Design", RFIC, p. 419, 2007.
Patrick Reynaert, "A 2.45-GHz 0.13-um CMOS PA With Parallel Amplification", JSSC, p. 551, 2007.
Nai-Shuo Cheng, "40-W CW Broad-Band Spatial Power Combiner Using Dense Finline Arrays", TMTT, p. 1070, 1999.

* cited by examiner

*Primary Examiner*—Anh T Mai
(74) *Attorney, Agent, or Firm*—Winston Hsu (57) ABSTRACT

A transformer power combiner having a plurality of input ports and an output port is provided. The transformer power combiner includes a plurality of primary winding conductors and a plurality of secondary winding conductors. The primary winding conductors are electrically connected to the input ports, respectively; in addition, each of the primary winding conductors is electrically connected between a positive terminal and a negative terminal of a corresponding input port. The secondary winding conductors are magnetically coupled to the primary winding conductors, respectively. The secondary winding conductors are configured in a topology including series connection and parallel connection between a positive terminal and a negative terminal of the output port.

17 Claims, 10 Drawing Sheets

TRANSFORMER POWER COMBINER HAVING SECONDARY WINDING CONDUCTORS MAGNETICALLY COUPLED TO PRIMARY WINDING CONDUCTORS AND CONFIGURED IN TOPOLOGY INCLUDING SERIES CONNECTION AND PARALLEL CONNECTION

CROSS REFERENCE TO RELATED APPLICATIONS

This non-provisional application claims the benefit of U.S. Provisional Application No. 61/035,740, filed on Mar. 12, 2008, and included herein by reference.

BACKGROUND

The present invention relates to amplifying an input signal to be transmitted, and more particularly, to an on-chip transformer power combiner implemented in a power amplifier system that has high transformer coupling efficiency and high power combining efficiency.

Power combining technique is commonly employed in a power amplifier of a wireless communication system to provide signals to be transmitted (e.g., RF signals) with sufficient signal power. One possible power combining implementation is to use a transformer power combiner. Please refer to FIG. 1, which is a schematic diagram illustrating a conventional power amplifier system. The power amplifier system 100 includes a transformer power combiner 102 and a plurality of power amplifiers 104_1, 104_2, . . . , 104_N. Each of the power amplifiers 104_1, 104_2, . . . , 104_N can be modeled by an RF current source $i_1, i_2, \ldots, i_N$ connected to an impedance $r_S$ in parallel. In addition, parasitic impedance r also exists in the transformer power combiner 102.

Figure 1:
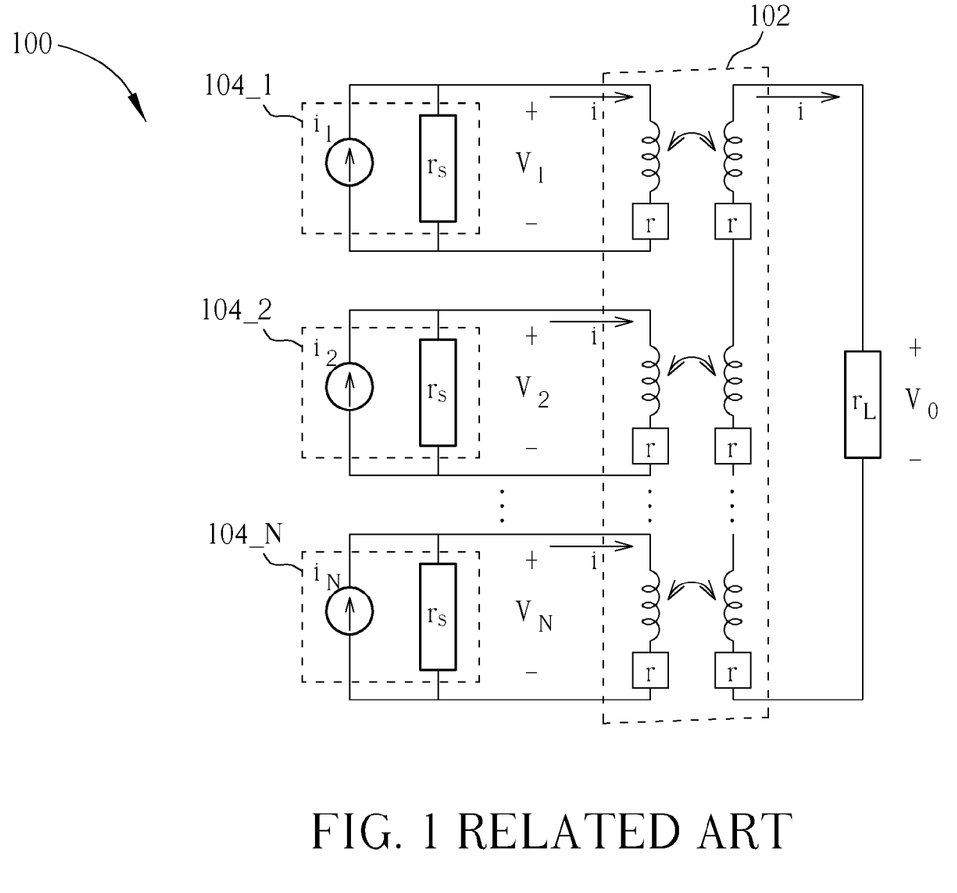
FIG. 1 is a schematic diagram illustrating a conventional power amplifier system.

Provided that the turn ratio is 1:1, the output voltage across the load impedance $r_L$ is equal to a sum of the input voltage levels $V_1, V_2, \ldots, V_N$ respectively presented at the input ports of the transformer power combiner 102. The input impedance $Z_{in}$ seen by a specific power amplifier at a corresponding input port can be expressed as equation (1) below:

$$Z_{in,i} = \frac{\left(2r + \frac{r_L}{N}\right)i_i + r_S\left(i_i - \frac{1}{N}\sum_{i=1}^{N}i_i\right)}{\frac{1}{N}\sum_{i=1}^{N}i_i} \quad (1)$$

In an ideal case where $i_1=i_2=\ldots=i_j=\ldots=i_N$ (i.e., the current i flowing through each primary winding is equal to the current i flowing through the secondary windings), the input impedance seen by each power amplifier is the same, namely $$Z_{in} = 2r + \frac{r_L}{N}.$$

In other words, in the ideal case, the input signals fed into the input ports of the transformer power combiner 102 are constructively synchronous with one another in phase and amplitude, whereby the optimum power combining efficiency could be achieved for delivering maximum power at the output port of the transformer power combiner 102. However, for the on-chip transformer power combiner employed in the power amplifier system manufactured utilizing a silicon technology such as a CMOS technology, the capacitive coupling among the primary and secondary windings adversely exists. As a result, the input signals fed into the input ports of the transformer power combiner 102 do not keep synchronous with one another because the input impedance seen by each power amplifier is not equal to the same value due to the undesired capacitive coupling.

For example, in a case where $$i_j = -\sum_{\substack{i=1 \\ i \neq j}}^{N} i_i$$

caused by the undesired capacitive coupling, the corresponding input impedance $Z_{in,j}$ is infinitely large (i.e., $Z_{in,j}=\infty$) meaning that the input port is an open circuit; in another case where $$\left(i_j + \sum_{\substack{i=1 \\ i \neq j}}^{N} i_i\right) < 0$$

caused by the undesired capacitive coupling, the corresponding input impedance $Z_{in,j}$ is a negative value (i.e., $Z_{in,j}<0$), meaning that the system would become unstable.

Briefly summarized, the on-chip transformer power combiner under deep-scaled technology is sure to suffer greatly from the capacitive coupling. For example, the load impedance seen by the power amplifier may not match to an optimum impedance value desired by the power amplifier. As a result, the power combining efficiency is degraded and the actual output power fails to reach the maximum value as desired. Furthermore, it is possible that the load impedance seen by the power amplifier becomes negative. As a result, power delivered from the power amplifier would be returned from the output port of the transformer power combiner, resulting in system unstability. In addition, as illustrated by the aforementioned equation (1) showing that the input impedance at each input port is highly dependent upon characteristics of other input ports, the nonlinearity of the output power generated from the transformer power combiner occurs due to the varying amplitude/phase of the input signal fed into each input port of the transformer power combiner.

There are many conventional ways to implement the transformer using metal conductors routed in an integrated circuit. For example, an on-chip transformer can be implemented using a one-side coplanar design, a two-side coplanar design, a broadside design, or a hybrid design. In general, the on-chip transformer with better coupling efficiency and less coupling loss causes more capacitive coupling among the primary and secondary windings, thus resulting in poor power combining efficiency and/or system instability as mentioned above. That is, using highly resistive and highly capacitive metal layers in deep scaled technology to build circuit components induces large coupling capacitance for the low-loss transformer design, leading to imbalanced and inefficient power combining result, especially for high-frequency application (e.g., the mmWave application). In a worst case, the overall system is unstable.

Therefore, these is a trade-off between two design parameters, transformer efficiency and power combining efficiency, for the conventional on-chip transformer power combiner design. A solution which can unbound these two design parameters is highly desired for power amplifier systems, especially for those power amplifier systems operated under high frequency such as the frequency about 60 GHz or above in mmWave application.

SUMMARY

One of the objectives of the present invention is therefore to provide an on-chip transformer power combiner having secondary winding conductors magnetically coupled to primary winding conductors and configured in a topology including series connection and parallel connection, thereby achieving high transformer coupling efficiency and high power combining efficiency.

According to an aspect of the present invention, a transformer power combiner having a plurality of input ports and an output port is provided. The transformer power combiner includes: a plurality of primary winding conductors, electrically connected to the input ports respectively, wherein each of the primary winding conductors is electrically connected between a positive terminal and a negative terminal of a corresponding input port; and a plurality of secondary winding conductors, magnetically coupled to the primary winding conductors respectively, wherein the secondary winding conductors are configured in a topology including series connection and parallel connection between a positive terminal and a negative terminal of the output port.

In one implementation, the primary winding conductors and the secondary winding conductors are configured to form a plurality of current combiners electrically connected to a voltage combiner. Each of the current combiners is configured to combine currents flowing therethrough, and the voltage combiner is configured to combine voltages across the current combiners to generate an output at the output port.

In another implementation, the primary winding conductors and the secondary winding conductors form a plurality of voltage combiners electrically connected to a current combiner. Each of the voltage combiners is configured to combine voltages across therein, and the current combiner is configured to combine currents flowing through the voltage combiners to thereby generate an output at the output port.

According to another aspect of the present invention, a transformer power combiner is provided. The transformer power combiner includes a plurality of current combiners coupled in series, the current combiners comprising a plurality of primary winding conductors magnetically coupled to a plurality of secondary winding conductors respectively, wherein each of the current combiners is configured to combine currents flowing therethrough; and a voltage combiner, coupled to a series connection of the current combiners, the voltage combiner being configured to combine voltages across the current combiners to thereby generate an output of the transformer power combiner.

According to yet another aspect of the present invention, a transformer power combiner is provided. The transformer power combiner includes a plurality of voltage combiners coupled in parallel, the voltage combiners comprising a plurality of primary winding conductors magnetically coupled to a plurality of secondary winding conductors respectively, wherein each of the voltage combiners is configured to combine voltages across therein; and a current combiner, coupled to a parallel connection of the voltage combiners, the current combiner being configured to combine currents flowing through to thereby generate an output of the transformer power combiner.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 2:
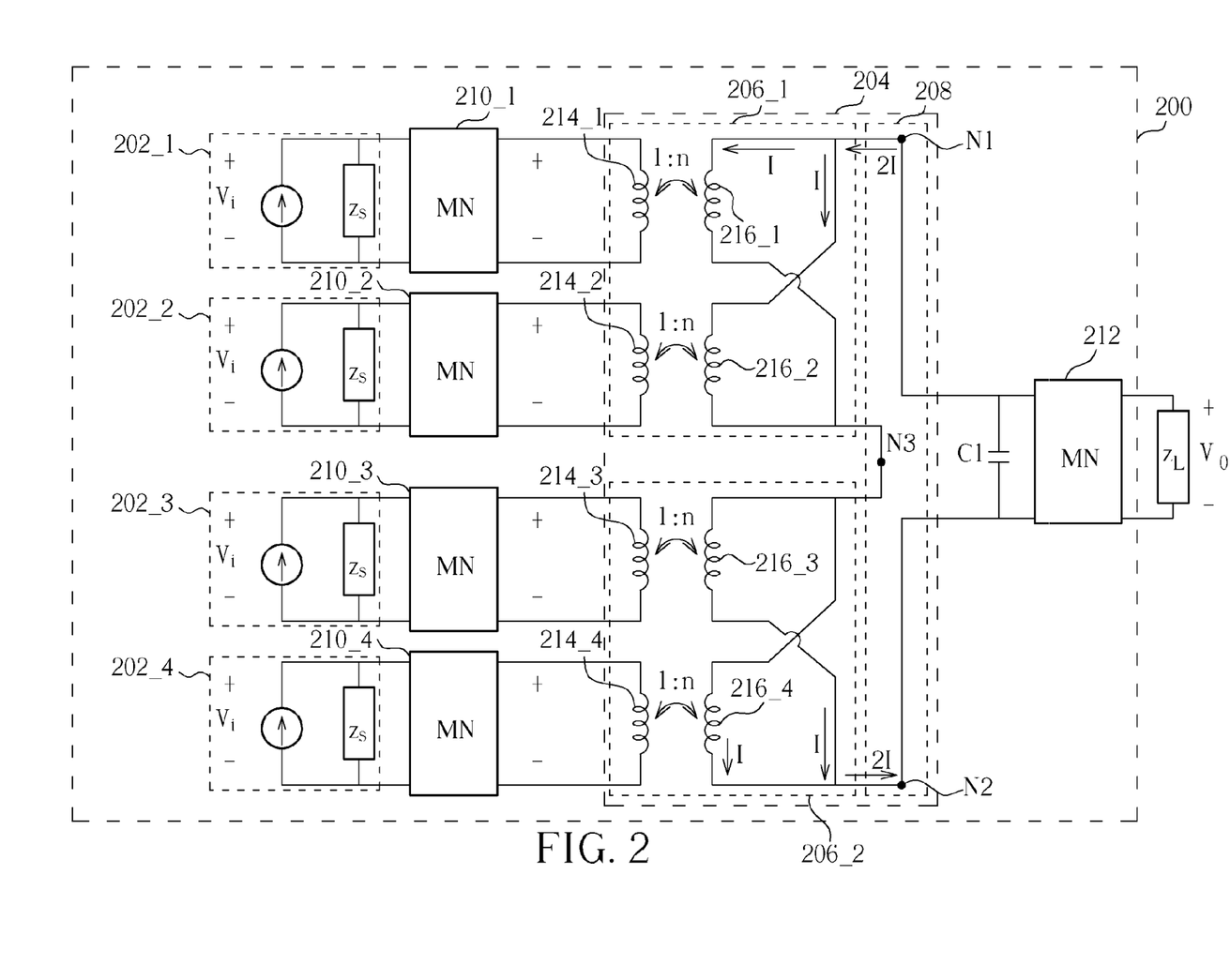
FIG. 2 is a schematic diagram illustrating a first exemplary embodiment of a power amplifier system according to the present invention.

FIG. 2 is a schematic diagram illustrating a first exemplary embodiment of a power amplifier system according to the present invention. The exemplary power amplifier system 200 includes a plurality of power amplifiers 202_1, 202_2, 202_3, 202_4 and a transformer power combiner 204. The transformer power combiner 204 has a plurality of input ports respectively coupled to the power amplifiers 202_1-202_4, and an output port coupled to an output load $Z_L$. The transformer power combiner 204 is configured to include current combiners 206_1 and 206_2 formed by a plurality of primary winding conductors 214_1, 214_2, 214_3, 214_4 and a plurality of secondary winding conductors 216_1, 216_2, 216_3, 216_4; in addition, the transformer power combiner 204 also includes a voltage combiner 208. Each of the current combiners 206_1 and 206_2 is configured to combine currents flowing therethrough (e.g., 2I=I+I), and the voltage combiner 208 is configured to combine voltages across the current combiners (e.g., the voltage between N1 and N3 and the voltage between N3 and N2) to generate an output $V_O$ at the output port.

As shown in FIG. 2, the primary winding conductor 214_1 is electrically connected between a positive terminal (+) and a negative terminal (−) of a corresponding input port and is further magnetically coupled to the secondary winding conductor 216_1, the primary winding conductor 214_2 is electrically connected between a positive terminal (+) and a negative terminal (−) of a corresponding input port and is further magnetically coupled to the secondary winding conductor 216_2, the primary winding conductor 214_3 is electrically connected between a positive terminal (+) and a negative terminal (−) of a corresponding input port and is further magnetically coupled to the secondary winding conductor 216_3, and the primary winding conductor 214_4 is electrically connected between a positive terminal (+) and a negative terminal (−) of a corresponding input port and is further magnetically coupled to the secondary winding conductor 216_4. In addition, a plurality of matching networks (MNs) 210_1, 210_2, 210_3, 210_4, 212 are also implemented in the power amplifier system 200 for impedance matching purposes. As the implementation of the matching networks are well known to those skilled in the art, further description is omitted here for brevity. In this exemplary embodiment shown in FIG. 2, only four power amplifiers 202_1-202_4 are shown for illustrative purposes; however, this is not meant to be a limitation of the present invention. In other alternative designs obeying the spirit of the present invention, the transformer power combiner can be implemented for combining power of more than four power amplifiers, depending upon design considerations.

As shown in FIG. 1, the secondary winging conductors configured in the conventional transformer power combiner are connected in series. In contrast to the conventional design, the secondary winding conductors 216_1-216_4 in the exemplary embodiment shown in FIG. 2, however, are configured in a topology including series connection and parallel connection between a positive terminal N1 and a negative terminal N2 of the output port of the transformer power combiner 204. More specifically, the secondary winding conductors 216_1 and 216_2 are connected in parallel between the positive terminal N1 of the output port and a connecting node N3, and the secondary winding conductors 216_3 and 216_4 are connected in parallel between the connecting node N3 and the negative terminal N2 of the output port. Provided that the turn ratio is 1:1, the impedance seen by the power amplifier 202_1 is therefore determined by the secondary winding conductor 216_1 connected to the secondary winding conductor 216_2 in parallel and then further connected to a parallel connection of the secondary winding conductors 216_3 and 216_4 in series; similarly, the impedance seen by the power amplifier 202_2 is therefore determined by the secondary winding conductor 216_2 connected to the secondary winding conductor 216_1 in parallel and then further connected to a parallel connection of the secondary winding conductors 216_3 and 216_4 in series, the impedance seen by the power amplifier 202_3 is therefore determined by the secondary winding conductor 216_3 connected to the secondary winding conductor 216_4 in parallel and then further connected to a parallel connection of the secondary winding conductors 216_1 and 216_2 in series, and the input impedance seen by the power amplifier 202_4 is therefore determined by the secondary winding conductor 216_4 connected to the secondary winding conductor 216_3 in parallel and then further connected to a parallel connection of the secondary winding conductors 216_1 and 216_2 in series. As one can see, the input impedance seen by each of the power amplifier 202_1-202_4 is the same due to the secondary winding conductors 216_1-216_4 connected through a novel topology including series connection and parallel connection between the positive terminal N1 and the negative terminal N2 of the output port. In this way, if the power amplifiers 202_1-202_4 are well-designed such that each power amplifier is modeled by the same RF current source and the same impedance $Z_S$, all of the input signals $V_i$ generated from the power amplifiers 202_1-202_4 would be synchronous with one another, resulting in synchronous amplitude/phase of the input current/voltage of the transformer power combiner 204.

Figure 3:
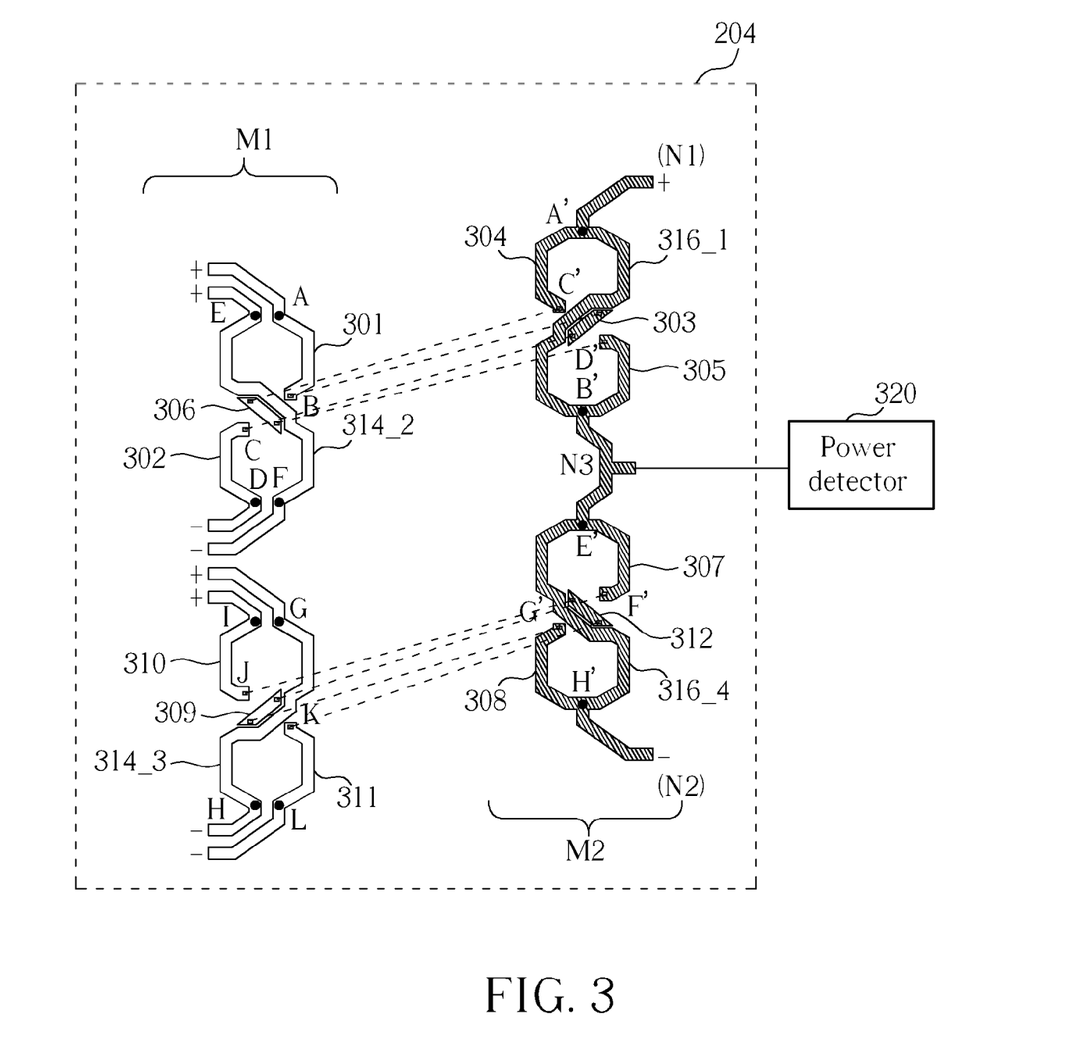
FIG. 3 is a diagram illustrating an exemplary layout of a transformer power combiner according to the present invention.

Based on the configuration of the novel transformer power combiner 204 shown in FIG. 2, a layout of the on-chip transformer power combiner 204 should be well defined in an integrated circuit to achieve the desired objective of making the input impedance seen by each of the power amplifiers 202_1-202_4 substantially the same. Please refer to FIG. 3, which is a diagram illustrating an exemplary layout of a transformer power combiner according to the present invention. For example, in one implementation, the exemplary layout shown in FIG. 3 is designed to realize the transformer power combiner 204 in FIG. 2. Shown on the left side are conductive metal lines routed on a first metal layer M1, while shown on the right side are conductive metal lines routed on a second metal layer M2 different from the first metal layer M1. Please note that the naming of the metal layers is not meant to limit the position relationship of the first and second metal layers. For example, in one implementation, the first metal layer is configured to be disposed under the second metal layer; however, in another implementation, the first metal layer could be alternatively disposed above the second metal layer. In short, the metal layers on which the primary and secondary winding conductors are routed depend upon design requirements. In addition, it should be noted that the layout design shown in FIG. 3 is for illustrative purposes only, and is not meant to be a limitation of the present invention. That is to say, other alternative layout designs obeying the spirit of the present invention still fall within the scope of the present invention.

As clearly illustrated in FIG. 3, a partial layout of the transformer power combiner 204 on the first metal layer M1 is substantially symmetric, and a partial layout of the transformer power combiner 204 on the second metal layer M2 is substantially symmetric as well. In this exemplary embodiment, a primary winding conductor, which is used for implementing the primary winding conductor 214_1 in FIG. 2, includes a first section 301 (between nodes A and B) and a second section 302 (between nodes C and D) routed on the first metal layer M1, and a third section 303 routed on the second metal layer M2 and interconnecting the first section 301 and the second section 302 through vias represented by broken lines illustrated in FIG. 3; a secondary winding conductor 316_1, which is used for implementing the secondary winding conductor 216_1 in FIG. 2 (and corresponds to the primary winding conductor used for implementing the primary winding conductor 214_1 in FIG. 2), is routed on the second metal layer between nodes A' and B', where node A' is electrically connected to the positive terminal N1 of the output port and node B' is electrically connected to the connecting node N3. A primary winding conductor 314_2 used for implementing the primary winding conductor 214_2 in FIG. 2 is routed on the first metal layer M1 between nodes E and F.

A projected pattern of the third section 303 on the first metal layer M1 intersects the primary winding conductor 314_2, which is more clearly shown in following figures. A secondary winding conductor, which is used for implementing the secondary winding conductor 216_2 in FIG. 2 and corresponds to the primary winding conductor 314_2, has a first section 304 (between nodes A' and C') and a second section 305 (between nodes D' and B') routed on the second metal layer M2, and a third section 306 routed on the first metal layer M1 and interconnecting the first section 304 and the second section 305 through vias represented by broken lines. A projected pattern of the third section 306 on the second metal layer M2 intersects the secondary winding conductor 316_1, which is more clearly shown in following figures.

A primary winding conductor 314_3, which is used for implementing the primary winding conductor 214_3 in FIG. 2, is routed on the first metal layer M1 between nodes G and H; a secondary winding conductor, which is used for implementing the secondary winding conductor 216_3 in FIG. 2 and corresponds to the primary winding conductor 314_3, has a first section 307 (between nodes E' and F') and a second section 308 (between nodes G' and H') routed on the second metal layer M2, and a third section 309 routed on the first metal layer M1 and interconnecting the first section 307 and the second section 308 through vias represented by broken lines. A primary winding conductor used for implementing the primary winding conductor 214_4 in FIG. 2 has a first section 310 (between nodes I and J) and a second section 311 (between nodes K and L) routed on the first metal layer M1, and a third section 312 routed on the second metal layer M2 and interconnecting the first section 310 and the second section 311 through vias represented by broken lines. A projected pattern of the third section 312 on the first metal layer M1 intersects the primary winding conductor 314_3, which is more clearly shown in following figures. A secondary winding conductor 316_4, which is used for implementing the secondary winding conductor 216_4 in FIG. 2, is routed between nodes E' and H' on the second metal layer M2. As one can see, node E' is electrically connected to the connecting node N3, and node H' is electrically connected to the negative terminal N2 of the output port; in addition, a projected pattern of the third section 309 on the second metal layer M2 intersects the secondary winding conductor 316_4, which is more clearly shown in the following figures.

Furthermore, the connecting node N3 shown in FIG. 2 could be coupled to a power detector 320 used for detecting power at the output port of the transformer power combiner 204. Therefore, based on the power detection result, other circuits can adjust the power of the power amplifiers connected to input ports of the transformer power combiner 204. However, such a power detector configuration is optional. In other words, the power detector 320 could be omitted according to actual design requirements.

Figure 4:
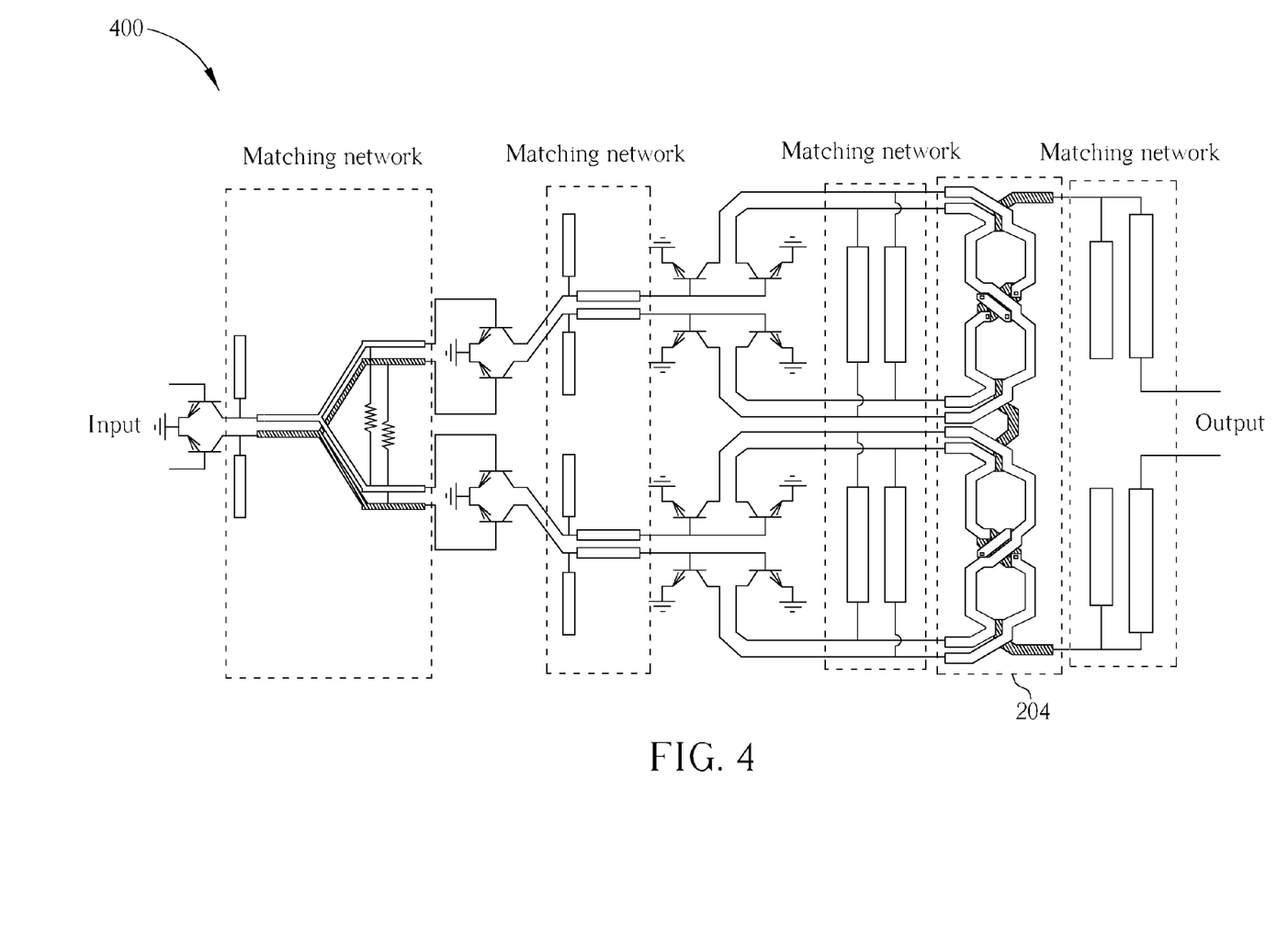
FIG. 4 shows an exemplary layout of a power amplifier system using BJT/HBT components and the power combiner with the layout shown in FIG. 3.
Figure 5:
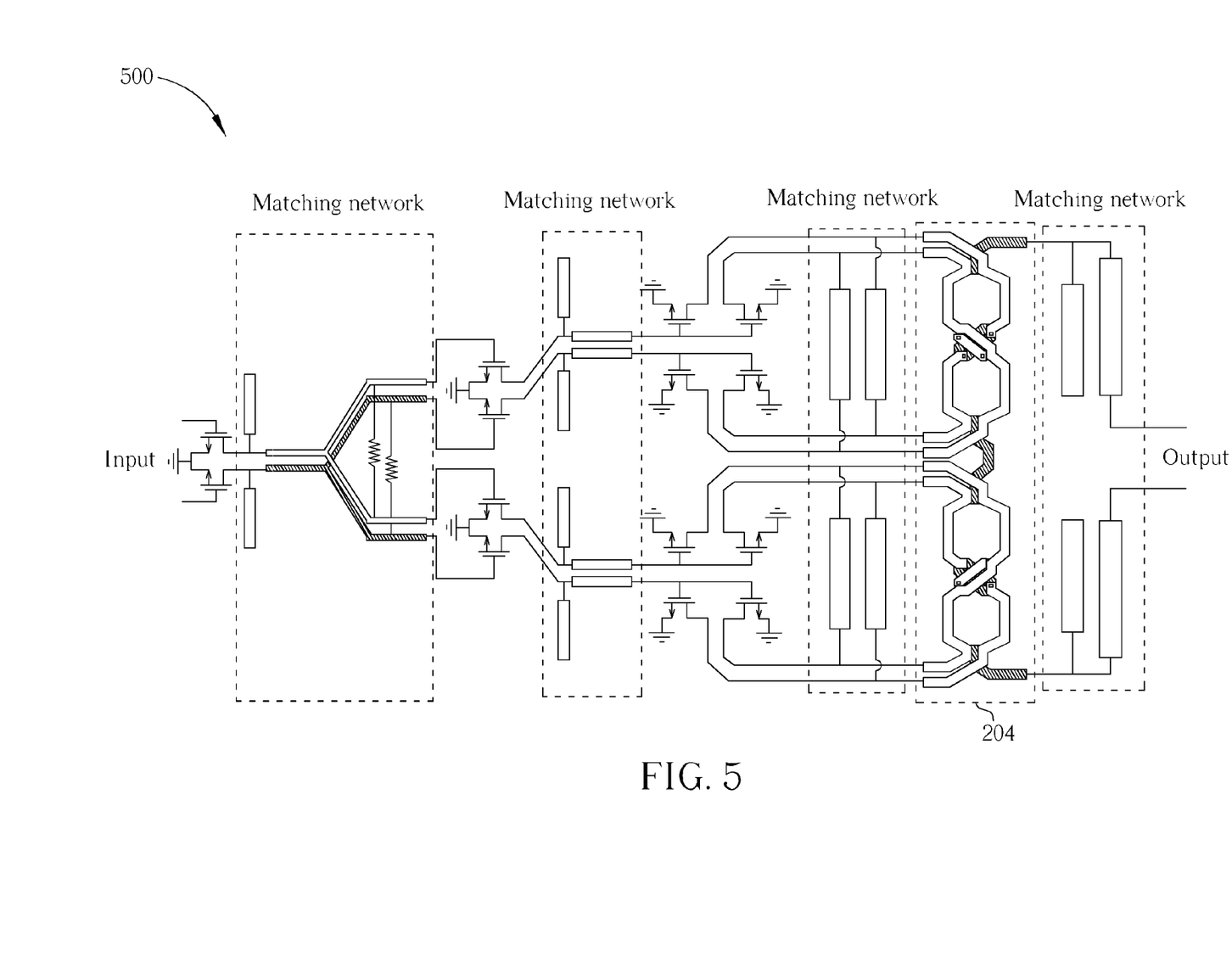
FIG. 5 shows another exemplary layout of a power amplifier system using FET components and the power combiner with the layout shown in FIG. 3.

Please refer to FIG. 3 in conjunction with FIG. 4 and FIG. 5. FIG. 4 shows an exemplary layout of a power amplifier system 400 using BJT/HBT components and the power combiner 204 with the layout shown in FIG. 3, and FIG. 5 shows another exemplary layout of a power amplifier system 500 using FET components and the power combiner 204 with the layout shown in FIG. 3. It should be noted that the power detector connections are omitted in the exemplary embodiments shown in FIG. 4 and FIG. 5. As clearly illustrated in FIG. 4 and FIG. 5, the overall transformer power combiner substantially has a symmetric layout. For example, a first projected pattern of the primary winding conductors (including the primary winding conductor composed of sections 301-303 and the primary winding conductor 314_2) and the secondary winding conductors (including the secondary winding conductor 316_1 and the secondary winding conductor composed of sections 304-306) on a plane parallel to either the first metal layer M1 or the second metal layer M2 is substantially symmetric, and a second projected pattern of the primary winding conductors (including the primary winding conductor 314_3 and the primary winding conductor composed of 310-312) and the secondary winding conductors (including the secondary winding conductor composed of sections 307-309 and the secondary winding conductor 316_4) on a plane parallel to either the first metal layer M1 or the second metal layer M2 is substantially symmetric. In addition, a partial layout of the transformer power combiner 204 on the first metal layer M1 is substantially symmetric (e.g., a layout pattern of the primary winding conductor 314_2 and sections 301, 302, 306 is a mirrored pattern of a layout pattern of the primary winding conductor 314_3 and sections 309, 310, 311), and a partial layout of the transformer power combiner 204 on the second metal layer M2 is also substantially symmetric (e.g., a layout pattern of the secondary winding conductor 316_1 and sections 303, 304, 305 is a mirrored pattern of a layout pattern of the secondary winding conductor 316_4 and sections 307, 308, 312). In this way, due to the well-defined substantially symmetric layout, the input impedance seen by each of the power amplifiers is substantially the same regardless of the coupling efficiency of the transformers implemented in the transformer power combiner. Furthermore, as the transformers in this exemplary embodiment are implemented using broadside design (e.g., one primary winding section and one secondary winding section overlapped in a direction perpendicular to the metal layer) and one-side coplanar design (e.g., adjacent primary and secondary winding sections routed on the same metal layer) according to the exemplary layout shown in FIG. 3, the transformer coupling efficiency is improved. In this way, the on-chip transformer power combiner configured using the circuit layout shown in FIG. 3 can achieve high transformer coupling efficiency and high power combining efficiency.

Figure 6:
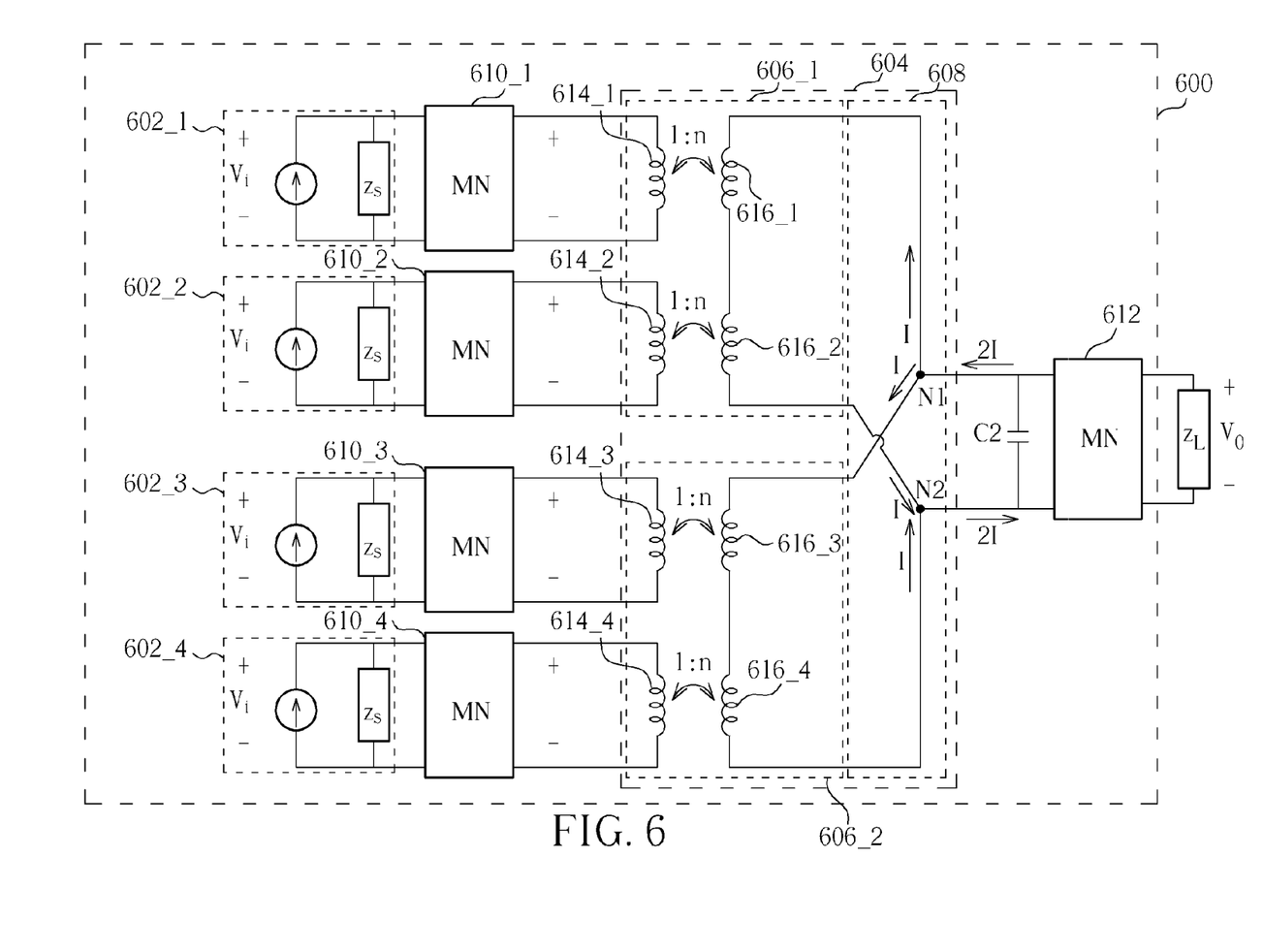
FIG. 6 is a schematic diagram illustrating a second exemplary embodiment of a power amplifier system according to the present invention.

FIG. 6 is a schematic diagram illustrating a second exemplary embodiment of a power amplifier system according to the present invention. The exemplary power amplifier system 600 includes a plurality of power amplifiers 602_1, 602_2, 602_3, 602_4 and a transformer power combiner 604. The transformer power combiner 604 has a plurality of input ports respectively coupled to the power amplifiers 602_1-602_4, and an output port coupled to an output load $Z_L$. The transformer power combiner 604 is configured to include a plurality of voltage combiners 606_1, 606_2 and a current combiner 608. The voltage combiners 606_1, 606_2 are formed by a plurality of primary winding conductors 614_1, 614_2, 614_3, 614_4 and a plurality of secondary winding conductors 616_1, 616_2, 616_3, 616_4. The voltage combiner 606_1 is configured to combine voltages across therein (e.g., the voltage across the secondary winding conductor 616_1 and the voltage across the secondary winding conductor 616_2); similarly, the voltage combiner 606_2 is configured to combine voltages across therein (e.g., the voltage across the secondary winding conductor 616_3 and the voltage across the secondary winding conductor 616_4). The current combiner 608 is configured to combine currents flowing through the voltage combiners 606_1 and 606_2 (e.g., 2I=I+I), thereby generating an output $V_O$ at the output port of the transformer power combiner 604.

As shown in FIG. 6, the primary winding conductor 614_1 is electrically connected between a positive terminal (+) and a negative terminal (−) of a corresponding input port and is further magnetically coupled to the secondary winding conductor 616_1, the primary winding conductor 614_2 is electrically connected between a positive terminal (+) and a negative terminal (−) of a corresponding input port and is further magnetically coupled to the secondary winding conductor 616_2, the primary winding conductor 614_3 is electrically connected between a positive terminal (+) and a negative terminal (−) of a corresponding input port and is further magnetically coupled to the secondary winding conductor 616_3, and the primary winding conductor 614_4 is electrically connected between a positive terminal (+) and a negative terminal (−) of a corresponding input port and is further magnetically coupled to the secondary winding conductor 616_4. In addition, a plurality of matching networks (MNs) 610_1, 610_2, 610_3, 610_4, 612 are implemented in the power amplifier system 600 for impedance matching purposes. In this exemplary embodiment shown in FIG. 6, only four power amplifiers 602_1-602_4 are shown for illustrative purposes; however, this is not meant to be a limitation of the present invention. In other alternative designs obeying the spirit of the present invention are possible, the transformer power combiner can be implemented to combine power of more than four power amplifiers, depending upon design considerations.

Similar to the topology of the secondary winging conductors 216_1-216_4 shown in FIG. 2, the secondary winding conductors 616_1-616_4 in this exemplary embodiment shown in FIG. 6 are also configured in a topology including series connection and parallel connection between a positive terminal N1 and a negative terminal N2 of the output port; however, the secondary winding conductors 616_1 and 616_2 in this exemplary embodiment are connected in series between the positive terminal N1 and the negative terminal N2 of the output port, and the secondary winding conductors 616_3 and 616_4 in this exemplary embodiment are connected in series between the positive terminal N1 and the negative terminal N2 of the output port. As one can see, the series connection of the secondary winding conductors 616_1 and 616_2 and the series connection of the secondary winding conductors 616_3 and 616_4 are connected in parallel between the positive terminal N1 and the negative terminal N2 of the output port.

Provided that the turn ratio is 1:1, the input impedance seen by the power amplifier 602_1 is therefore determined by the secondary winding conductor 616_1 connected to the secondary winding conductor 616_2 in series and then further connected to a series connection of the secondary winding conductors 616_3 and 616_4 in parallel; similarly, the input impedance seen by the power amplifier 602_2 is therefore determined by the secondary winding conductor 616_2 connected to the secondary winding conductor 616_1 in series and then further connected to a series connection of the secondary winding conductors 616_3 and 616_4 in parallel, the input impedance seen by the power amplifier 602_3 is therefore determined by the secondary winding conductor 616_3 connected to the secondary winding conductor 616_4 in series and then further connected to a series connection of the secondary winding conductors 616_1 and 616_2 in parallel, and the input impedance seen by the power amplifier 602_4 is therefore determined by the secondary winding conductor 616_4 connected to the secondary winding conductor 616_3 in series and then further connected to a series connection of the secondary winding conductors 616_1 and 616_2 in parallel. It is appreciated that the input impedance seen by each of the power amplifiers 602_1-602_4 is the same due to the secondary winding conductors 616_1-616_4 connected through a novel topology including series connection and parallel connection between the positive terminal N1 and the negative terminal N2 of the output port. In this way, if the power amplifiers 602_1-602_4 are well-designed such that each power amplifier is modeled by the same RF current source and the same impedance $Z_S$, all of the input signals $V_i$ generated from the power amplifiers 602_1-602_4 would be synchronous with one another, resulting in synchronous amplitude/phase of the input current/voltage of the transformer power combiner 604.

Figure 7:
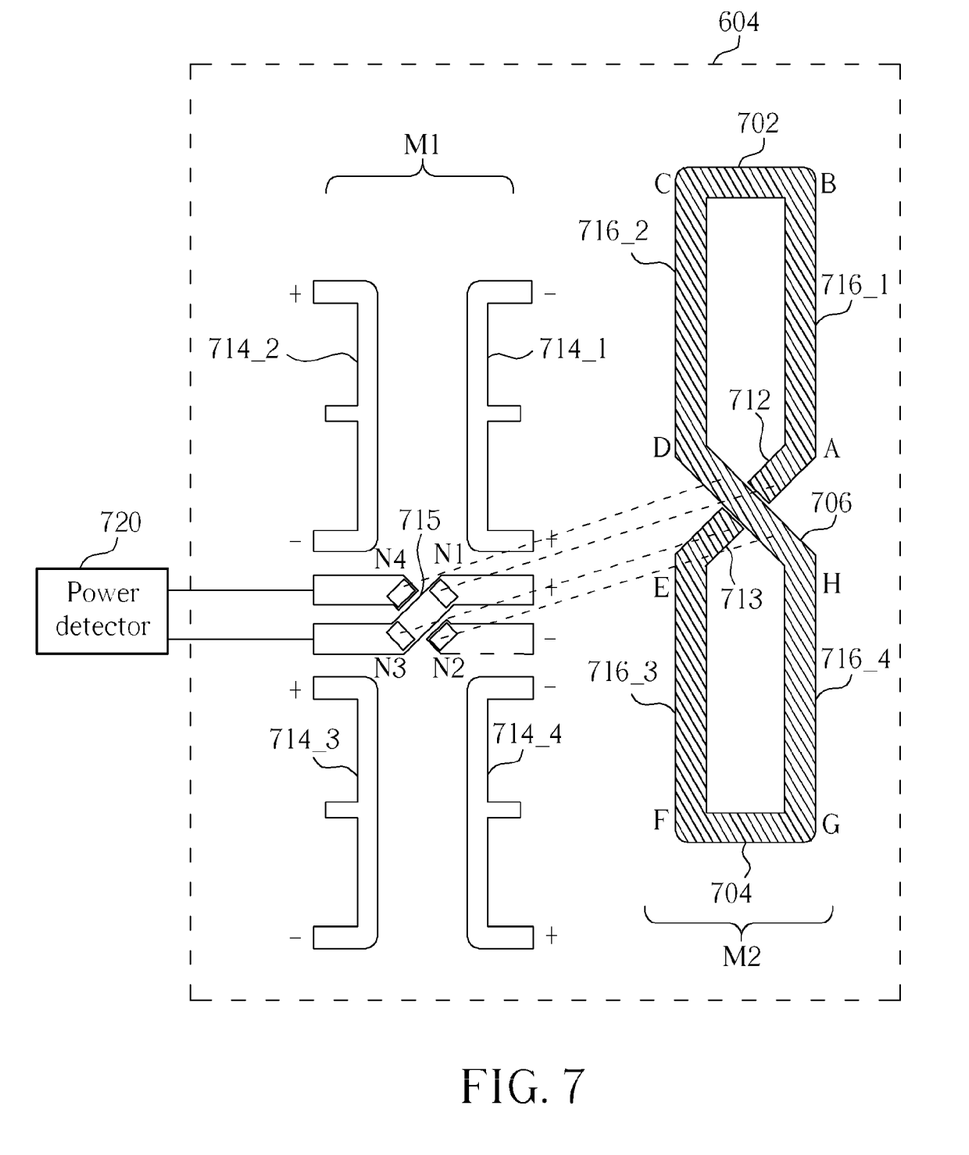
FIG. 7 is a diagram illustrating another exemplary layout of a transformer power combiner according to the present invention.

Based on the circuit configuration of the novel transformer power combiner 604 shown in FIG. 6, a layout of the on-chip transformer power combiner 604 should be well defined in an integrated circuit to achieve the desired objective of making the input impedance seen by each of the power amplifiers 602_1-602_4 substantially the same. Please refer to FIG. 7, which is a diagram illustrating another exemplary layout of a transformer power combiner according to the present invention. For example, in one implementation, the exemplary layout shown in FIG. 7 is to realize the transformer power combiner 604 in FIG. 6. Shown on the left side are conductive metal lines routed on a first metal layer M1, while shown on the right side are conductive metal lines routed on a second metal layer M2 different from the first metal layer M1. As mentioned above, the naming of the metal layers is not meant to limit the position relationship of the first and second metal layers M1 and M2. For example, in one implementation, the first metal layer M1 is configured to be disposed under the second metal layer M2; however, in another implementation, the first metal layer M1 could be alternatively disposed above the second metal layer M2. In short, the metal layers on which the primary and secondary winding conductors are routed depend upon design requirements. In addition, it should be noted that the layout design shown in FIG. 7 is for illustrative purposes only, and is not meant to be a limitation of the present invention. That is to say, other alternative layout designs obeying the spirit of the present invention still fall within the scope of the present invention.

In this embodiment using the layout in FIG. 7 to realize the transformer power combiner 604 in FIG. 6, the primary winding conductors 614_1-614_4 and the secondary winding conductors 616_1-616_4 in FIG. 6 are therefore implemented using primary winding conductors 714_1-714_4 and the secondary winding conductors 716_1-716_4 in FIG. 7, respectively. As clearly illustrated in FIG. 7, the primary winding conductors 714_1-714_4 are routed on the first metal layer M1 of the integrated circuit symmetrically, and the secondary winding conductors 716_1-716_4 are also routed on the second metal layer M2 of the integrated circuit symmetrically. In this exemplary embodiment, the first secondary winding conductor 716_1 (between nodes A and B) and the second secondary winding conductor 716_2 (between nodes C and D) are electrically connected by a first conductor 702 routed between nodes B and C on the second metal layer M2; the third secondary winding conductor 716_3 (between nodes E and F) and the fourth secondary winding conductor 716_4 (between nodes H and G) are electrically connected by a second conductor 704 routed between nodes F and G on the second metal layer M2; the second secondary winding conductor 716_2 and the fourth secondary winding conductor 716_4 are electrically connected by a third conductor 706 routed between nodes D and H on the second metal layer M2; and the first secondary winding conductor 716_1 and the third secondary winding conductor 716_3 are electrically connected by a fourth conductor electrically connected between nodes A and E, where the fourth conductor has a first section 712 and a second section 713 routed on the second metal layer M2, and a third section 715 routed on the first metal layer M1, and the first section 712, the second section 713, and the third section 715 are electrically connected through vias represented by broken lines shown in FIG. 7. Furthermore, the positive terminal N1 are electrically connected to the first section 712 through a via, and the negative terminal N2 is electrically connected to the third conductor 706 through a via. A projected pattern of the third section 715 on the second metal layer M2 intersects the third conductor 706, which is more clearly shown in following figures.

In addition, two connecting nodes N3 and N4 shown in FIG. 7 could be optionally formed and coupled to a power detector 720 used for detecting power at the output port of the transformer power combiner 604. Based on the power detection result, other circuits therefore can adjust the power of the power amplifiers 602_1-602_4 connected to input ports of the transformer power combiner 604. In this exemplary embodiment, as the connecting node N4 is electrically connected to the third conductor 706 through a via, the connecting node N4 is therefore electrically connected to the negative terminal N2. Regarding the connecting node N3, it is electrically connected to the positive terminal N1 through the third section 715. In this way, the voltage levels at the connecting nodes N1 and N2 can be successfully monitored by the power detector 720 that is coupled to the connecting nodes N3 and N4. However, it should be noted that such a power detector configuration is optional. That is, in other embodiments, the power detector 720 could be omitted according to actual design requirements. When the power detector 720 is not implemented due to design considerations, the connecting nodes N3 and N4, related vias electrically connected to the connecting nodes N3 and N4, and the signal traces routed between the connecting nodes N3 and N4 and the power detector 720 could be omitted accordingly.

Figure 8:
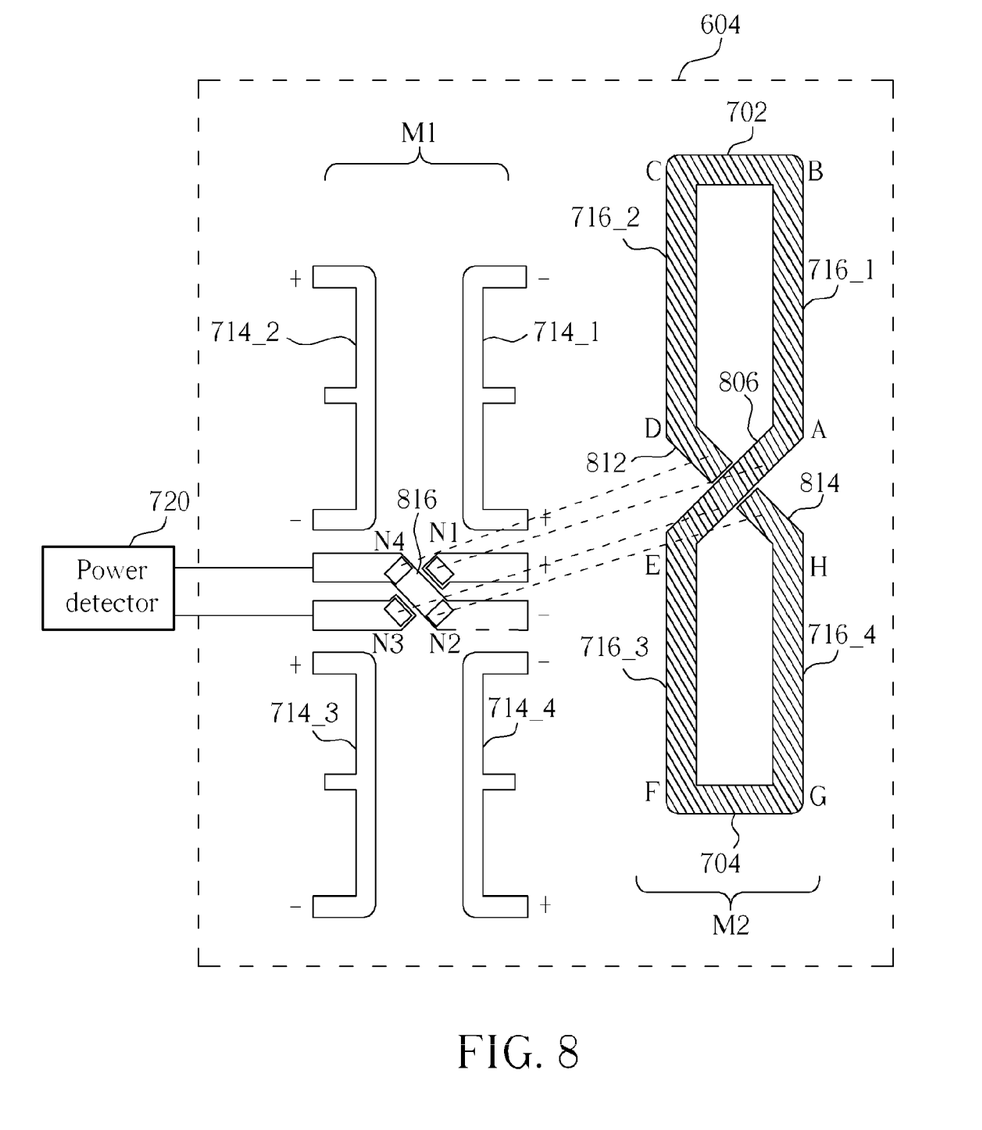
FIG. 8 is a diagram illustrating yet another exemplary layout of a transformer power combiner according to the present invention.

The layout shown in FIG. 7 is for illustrative purposes. Other alternative designs obeying the spirit of the invention are possible. Please refer to FIG. 8, which a diagram illustrating yet another exemplary layout of a transformer power combiner according to the present invention. For example, the exemplary layout shown in FIG. 8 is an alternative exemplary layout of the transformer power combiner 604 shown in FIG. 6. The layout shown in FIG. 8 is similar to that shown in FIG. 7. The difference is the connection configuration of nodes A, D, E, and H. As shown in FIG. 8, the first secondary winding conductor 716_1 and the third secondary winding conductor 716_3 are electrically connected by a third conductor 806 routed between nodes A and E on the second metal layer M2, and the second secondary winding conductor 716_2 and the fourth secondary winding conductor 716_4 are electrically connected by a fourth conductor electrically connected between nodes D and H, where the fourth conductor has a first section 812 and a second section 814 routed on the second metal layer M2, and a third section 816 routed on the first metal layer M1. In addition, the first section 812, the second section 814, and the third section 816 are electrically connected through vias represented by broken lines shown in FIG. 8. In this embodiment, the positive terminal N1 is electrically connected to the third conductor 806 through a via, and the negative terminal N2 is electrically connected to the second section 814 through a via. Furthermore, a projected pattern of the third section 816 on the second metal layer M2 intersects the third conductor 806. As a person skilled in the art would readily understand layout of the remaining portions in FIG. 8 after reading above disclosure directed to the layout shown in FIG. 7, further description is omitted here for brevity.

Figure 9:
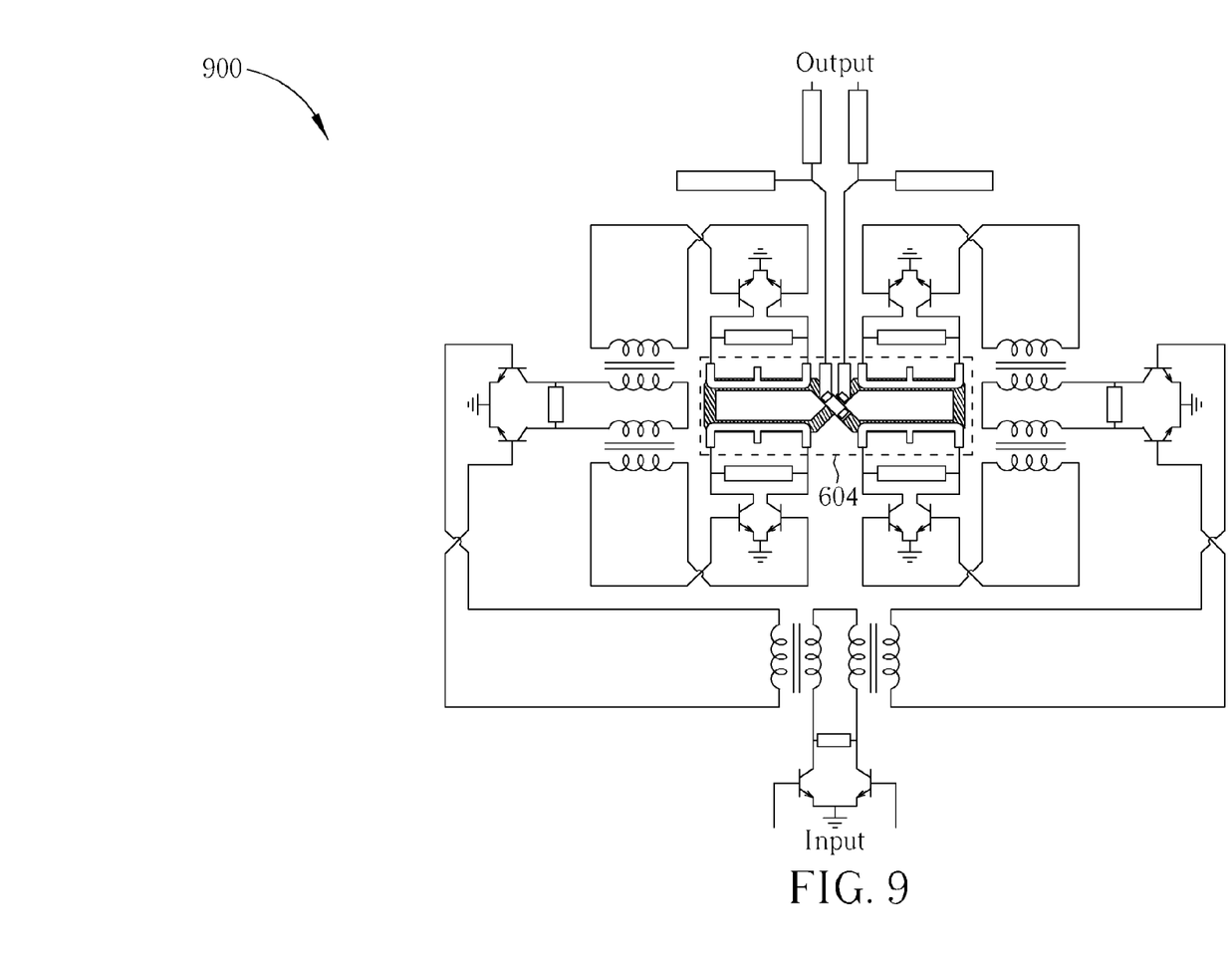
FIG. 9 shows an exemplary layout of a power amplifier system using BJT/HBT components and the power combiner with the layout shown in FIG. 7.
Figure 10:
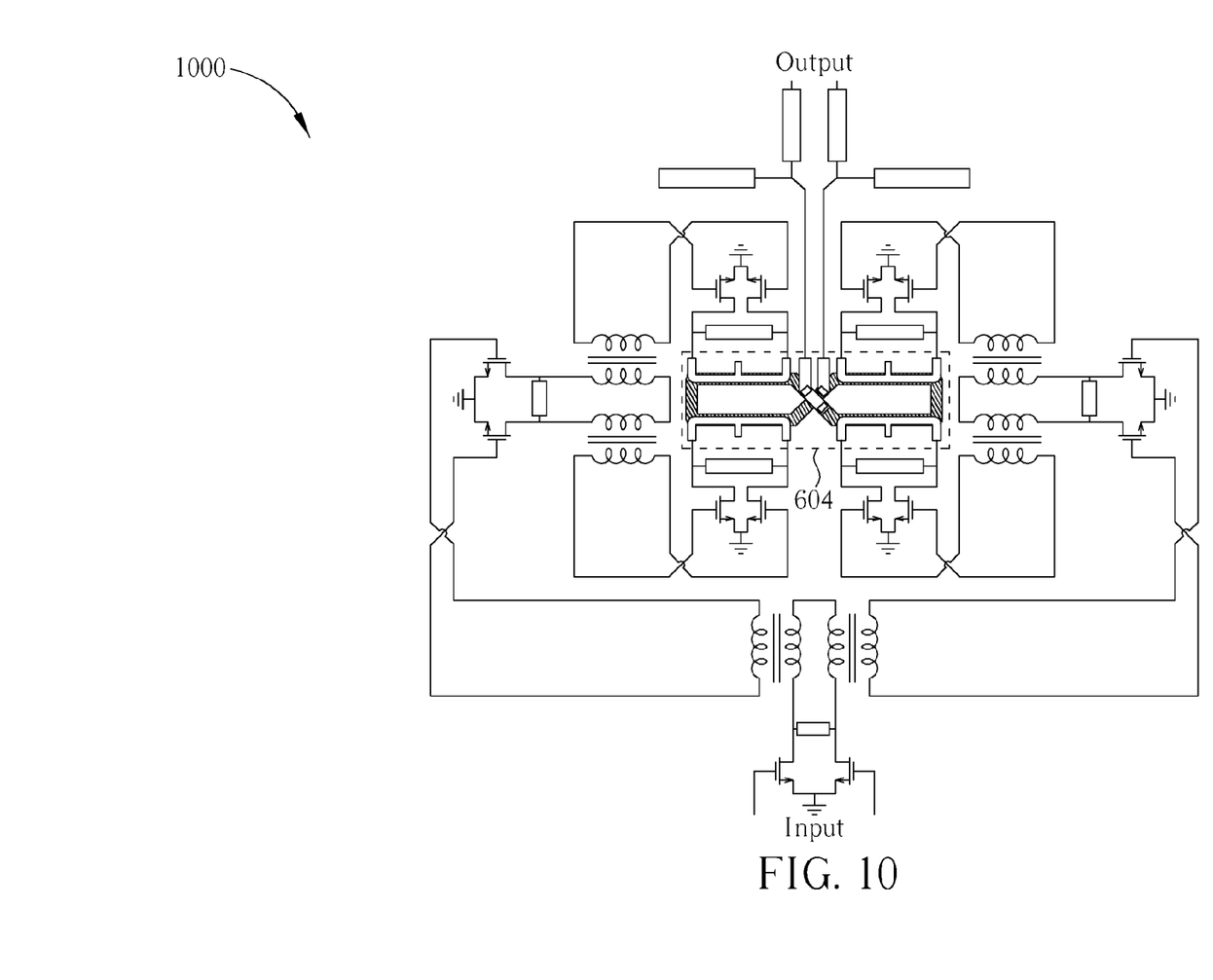
FIG. 10 shows another exemplary layout of a power amplifier system using FET components and the power combiner with the layout shown in FIG. 7.

Please refer to FIG. 7 in conjunction with FIG. 9 and FIG. 10. FIG. 9 shows an exemplary layout of a power amplifier system 900 using BJT/HBT components and the power combiner 604 in FIG. 7, and FIG. 10 shows another exemplary layout of a power amplifier system 1000 using FET components and the power combiner 604 in FIG. 7. It should be noted that the power detector connections are omitted in the exemplary embodiments shown in FIG. 9 and FIG. 10. As clearly illustrated in FIG. 9 and FIG. 10, the overall transformer power combiner substantially has a symmetric layout. That is, as illustrated in FIG. 7 and FIG. 8, the primary winding conductors 714_1-714_4 are symmetrically routed on the first metal layer M1, and the secondary winding conductors 716_1-716_4 are symmetrically routed on the second metal layer M2. In this way, due to the well-defined substantially symmetric layout, the input impedance seen by each of the power amplifier is substantially the same regardless of the coupling efficiency of the transformers implemented in the transformer power combiner. Furthermore, as the transformers in this exemplary embodiment are implemented using a broadside design according to the exemplary layouts shown in FIG. 7 and FIG. 8, the transformer coupling efficiency is improved. In this way, the on-chip transformer power combiner configured using the circuit layouts shown in FIG. 7 or FIG. 8 can achieve high transformer coupling efficiency and high power combining efficiency.

In addition, the present invention further proposes a novel load impedance optimization technique detailed hereinafter. Please refer to the exemplary embodiment shown in FIG. 2 again. An optional capacitive component (e.g., a capacitor C1) could be electrically connected between the positive terminal N1 and the negative terminal N2 of the output port for tuning the load impedance seen by the power amplifiers. As the transformer generally include parasitic inductors, the capacitor C1 is therefore implemented for resonating the transformer inductance to alleviate the effect caused by parasitic inductors, thereby properly tuning load impedance toward a desired value. Similarly, as shown in the other exemplary embodiment in FIG. 6, an optional capacitive component (e.g., a capacitor C2) could be electrically connected between the positive terminal N1 and the negative terminal N2 of the output port for tuning the load impedance. In view of the layout designs shown in FIG. 7 and FIG. 8, as connecting nodes N3 and N4 are electrically connected to the positive and negative terminals N1 and N2 respectively, the capacitor C2 in FIG. 6 could be connected between N1 and N4, or between N2 and N3; in addition, provided that the optional power detector 720 is not implemented in the system, the capacitor C2 in FIG. 6 is allowed to be connected between N3 and N4.

Furthermore, with proper design of the power detectors 320, 720, the power detectors 320, 720 not only can be arranged to detect output power at the output port of the transformer power combiner, but also can be used to tune the load impedance. That is, in addition to detecting output power, the power detector 720 implemented in the communication system is further configured to have a capacitive characteristic seen between the positive terminal N1 and the negative terminal N2 of the output port to thereby tune the load impedance. In this case where the power detector 720 is further used for load impedance optimization, the capacitive components (i.e., the capacitor C2 shown in FIG. 6) thus could be omitted. Following the same conception mentioned above, the layout of the transformer power combiner 204 in FIG. 3 can be modified to have a capacitor or power detector connected between the positive terminal N1 and the negative terminal N2 for tuning the load impedance. In addition, provided that the layout symmetry is retained, the layout shown in FIG. 3 could be properly modified to shorten the distance between the positive terminal N1 and the negative terminal N2 for reducing the layout complexity of the capacitor or power detector connection. For example, the top-right portion shown in FIG. 3 can be bent clockwise with respect to the connecting node N3, and the bottom-right portion shown in FIG. 3 can be bent counterclockwise with respect to the connecting node N3, whereby the distance between the positive terminal N1 and the negative terminal N2 is shortened. In order to keep the overall layout symmetric, the partial layout of the transformer power combiner 204 on the first metal layer M1 is properly bent in response to the aforementioned modification made to the partial layout of the transformer power combiner 204 on the second metal layer M2.

The fully synchronous transformer power combiners of the above embodiments are compatible to all classes (e.g., class A, class AB, etc.) of the power amplifier, and therefore can be employed in a variety of application fields. Moreover, the power combining performance of the transformer power combiners of the above embodiments are independent of the transformer design for all frequency bands. In other words, the transformer power combiner of the above embodiments can be not limited to only the high-frequency applications, such as mmWave applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transformer power combiner having a plurality of input ports and an output port, the transformer power combiner comprising:
    a plurality of primary winding conductors, electrically connected to the input ports respectively, wherein each of the primary winding conductors is electrically connected between a positive terminal and a negative terminal of a corresponding input port; and
    a plurality of secondary winding conductors, magnetically coupled to the primary winding conductors respectively, wherein the secondary winding conductors are configured in a topology including series and parallel connections between a positive terminal and a negative terminal of the output port.

2. The transformer power combiner of claim 1, further comprising a voltage combiner, wherein the primary winding conductors and the secondary winding conductors are configured to form a plurality of current combiners electrically connected to the voltage combiner, each of the current combiners is configured to combine currents flowing therethrough, and the voltage combiner is configured to combine voltages across the current combiners to generate an output at the output port.

3. The transformer power combiner of claim 1, wherein the secondary winding conductors comprise a first secondary winding conductor, a second secondary winding conductor, a third secondary winding conductor, and a fourth secondary winding conductor; the first secondary winding conductor and the second secondary winding conductor are electrically connected in parallel between the positive terminal of the output port and a connecting node; and the third secondary winding conductor and the fourth secondary winding conductor are electrically connected in parallel between the connecting node and the negative terminal of the output port.

4. The transformer power combiner of claim 3, being an on-chip transformer power combiner formed in an integrated circuit.

5. The transformer power combiner of claim 4, wherein the primary winding conductors and the secondary winding conductors are routed on the integrated circuit utilizing a first metal layer and a second metal layer; a partial layout of the transformer power combiner on the first metal layer is substantially symmetric; and a partial layout of the transformer power combiner on the second metal layer is substantially symmetric.

6. The transformer power combiner of claim 5, wherein the primary winding conductors comprise a first primary winding conductor magnetically coupled to the first secondary winding conductor, and a second primary winding conductor magnetically coupled to the second secondary winding conductor; the first primary winding conductor includes a first section and a second section routed on the first metal layer, and a third section routed on the second metal layer and interconnecting the first section and the second section of the first primary winding conductor through vias; the first secondary winding conductor is routed on the second metal layer; the second primary winding conductor is routed on the first metal layer, where a projected pattern of the third section of the first primary winding conductor on the first metal layer intersects the second primary winding conductor; the second secondary winding conductor has a first section and a second section routed on the second metal layer, and a third section routed on the first metal layer and interconnecting the first section and the second section of the second secondary winding conductor through vias, where a projected pattern of the third section of the second secondary winding conductor on the second metal layer intersects the first secondary winding conductor.

7. The transformer power combiner of claim 6, wherein a projected pattern of the first primary winding conductor, the second primary winding conductor, the first secondary winding conductor, and the second secondary winding conductor on a plane parallel to either the first metal layer or the second metal layer is substantially symmetric.

8. The transformer power combiner of claim 1, further comprising a current combiner, wherein the primary winding conductors and the secondary winding conductors form a plurality of voltage combiners electrically connected to the current combiner, each of the voltage combiners is configured to combine voltages across therein, and the current combiner is configured to combine currents flowing through the voltage combiners to thereby generate an output at the output port.

9. The transformer power combiner of claim 1, wherein the secondary winding conductors comprise a first secondary winding conductor, a second secondary winding conductor, a third secondary winding conductor, and a fourth secondary winding conductor; the first secondary winding conductor and the second secondary winding conductor are electrically connected in series between the positive terminal of the output port and the negative terminal of the output port; and the third secondary winding conductor and the fourth secondary winding conductor are electrically connected in series between the positive terminal of the output port and the negative terminal of the output port.

10. The transformer power combiner of claim 9, being an on-chip transformer power combiner formed in an integrated circuit.

11. The transformer power combiner of claim 10, wherein the primary winding conductors are routed on a first metal layer of the integrated circuit symmetrically; and the secondary winding conductors are routed on a second metal layer of the integrated circuit symmetrically.

12. The transformer power combiner of claim 11, wherein the first secondary winding conductor and the second secondary winding conductor are electrically connected by a first conductor routed on the second metal layer, the third secondary winding conductor and the fourth secondary winding conductor are electrically connected by a second conductor routed on the second metal layer, the second secondary winding conductor and the fourth secondary winding conductor are electrically connected by a third conductor, and the first secondary winding conductor and the third secondary winding conductor are electrically connected by a fourth conductor; one of the third conductor and the fourth conductor is routed on the second metal layer, while the other of the third conductor and the fourth conductor has a first section and a second section routed on the second metal layer, and a third section routed on the first metal layer and interconnecting the first section and the second section through vias, where a projected pattern of the third section on the second metal layer intersects the one of the third conductor and the fourth conductor routed on the second metal layer.

13. The transformer power combiner of claim 1, further comprising:
   a capacitive component, electrically connected between the positive terminal and the negative terminal of the output port, for tuning load impedance.

14. The transformer power combiner of claim 1, further comprising:
   a power detector, electrically connected between the positive terminal and the negative terminal of the output port, for detecting output power at the output port, wherein the power detector is further configured to have a capacitive characteristic seen between the positive terminal and the negative terminal of the output port to thereby tune load impedance.

15. A transformer power combiner comprising:
   a plurality of voltage combiners coupled in parallel, the voltage combiners comprising a plurality of primary winding conductors magnetically coupled to a plurality of secondary winding conductors respectively, wherein each of the voltage combiners is configured to combine voltages across therein; and
   a current combiner, coupled to a parallel connection of the voltage combiners, the current combiner being configured to combine currents flowing through to thereby generate an output of the transformer power combiner.

16. The transformer power combiner of claim 15, wherein the primary winding conductors are routed on a first metal layer of an integrated circuit symmetrically; and the secondary winding conductors are routed on a second metal layer of the integrated circuit symmetrically.

17. The transformer power combiner of claim 16, wherein the secondary winding conductors comprise a first secondary winding conductor, a second secondary winding conductor, a third secondary winding conductor, and a fourth secondary winding conductor; the first secondary winding conductor and the second secondary winding conductor are electrically connected by a first conductor routed on the second metal layer, the third secondary winding conductor and the fourth secondary winding conductor are electrically connected by a second conductor routed on the second metal layer, the second secondary winding conductor and the fourth secondary winding conductor are electrically connected by a third conductor, and the first secondary winding conductor and the third secondary winding conductor are electrically connected by a fourth conductor; one of the third conductor and the fourth conductor is routed on the second metal layer, while the other of the third conductor and the fourth conductor has a first section and a second section routed on the second metal layer, and a third section routed on the first metal layer and interconnecting the first section and the second section through vias, where a projected pattern of the third section on the second metal layer intersects the one of the third conductor and the fourth conductor routed on the second metal layer.

* * * * *